US011811078B2

United States Patent
Yoder et al.

(10) Patent No.: US 11,811,078 B2
(45) Date of Patent: Nov. 7, 2023

(54) FLEXIBLE BATTERY CONTAINMENT

(71) Applicant: Microsoft Technology Licensing, LLC, Redmond, WA (US)

(72) Inventors: Gregory Scott Yoder, Snoqualmie, WA (US); Minsoo Kim, Bothel, WA (US); Kai-Yi Lin, Taipei (TW)

(73) Assignee: Microsoft Technology Licensing, LLC, Redmond, WA (US)

( * ) Notice: Subject to any disclaimer, the term of this patent is extended or adjusted under 35 U.S.C. 154(b) by 237 days.

(21) Appl. No.: 17/237,726

(22) Filed: Apr. 22, 2021

(65) Prior Publication Data
US 2022/0344753 A1 Oct. 27, 2022

(51) Int. Cl.
*H01M 50/136* (2021.01)
*H01M 50/238* (2021.01)
*G06F 1/16* (2006.01)
*H05K 5/00* (2006.01)

(52) U.S. Cl.
CPC ........ *H01M 50/136* (2021.01); *G06F 1/1635* (2013.01); *H01M 50/238* (2021.01); *H05K 5/0086* (2013.01); *H01M 2220/30* (2013.01)

(58) Field of Classification Search
CPC ............. H01M 50/136; H01M 50/238; H01M 2220/30
See application file for complete search history.

(56) References Cited

U.S. PATENT DOCUMENTS 9,124,676 B2   9/2015   Allore et al.
2006/0292436 A1*  12/2006  Cook ................. H01M 50/296
                                         429/82

OTHER PUBLICATIONS

"International Search Report and Written Opinion Issued in PCT Application No. PCT/US22/023203", dated Sep. 9, 2022, 11 Pages.

* cited by examiner

*Primary Examiner* — Jane J Rhee
(74) *Attorney, Agent, or Firm* — Holzer Patel Drennan

(57) ABSTRACT

A computing device is disclosed. The computing device has a frame including a recessed battery compartment, the recessed battery compartment having a rigid back surface. The computing device further has a closure member having a rigid portion and a flexible portion, wherein a periphery of the closure member is coupled to a peripheral edge of the recessed battery compartment, the flexible portion to permit the rigid portion to move relative to the frame. The computing device further has a battery coupled to one or more of the battery compartment and the closure member, the battery oriented between and substantially adjacent to the rigid back surface of the battery compartment and the closure member.

20 Claims, 8 Drawing Sheets

FLEXIBLE BATTERY CONTAINMENT

BACKGROUND

A prevailing trend in mobile electronics is to make devices smaller and thinner. The vast majority of mobile electronic and computing devices require batteries to operate. The batteries are often among the largest components in mobile devices. Also, many batteries do not maintain a consistent size over their lifecycles. For example, even during regular course of normal use, most battery cells expand and contract (e.g., the battery cells swell when charged and shrink when discharged). This can yield a relatively significant expansion of a battery or battery pack within a computing device. Further, over time, the cells tend to swell independently of the expansion/contraction during charge/discharge cycles. This swelling that occurs over time can be considerably more significant than the swelling attributable to the charging cycles. Compensating for changes in battery size over time can present challenges for mobile electronics manufacturers attempting to make smaller and thinner devices.

SUMMARY

The described technology provides implementations of systems and methods for battery mounting. More specifically, the described technology provides implementations of systems and methods for reducing gaps in battery mount.

A computing device is disclosed. The computing device has a frame including a recessed battery compartment, the recessed battery compartment having a rigid back surface. The computing device further has a closure member having a rigid portion and a flexible portion, wherein a periphery of the closure member is coupled to a peripheral edge of the recessed battery compartment, the flexible portion to permit the rigid portion to move relative to the frame. The computing device further has a battery coupled to one or more of the battery compartment and the closure member, the battery oriented between and substantially adjacent to the rigid back surface of the battery compartment and the closure member.

This summary is provided to introduce a selection of concepts in a simplified form that is further described below in the Detailed Description. This summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

Systems and methods for containing batteries in computing devices are disclosed herein. Batteries are essential elements for most mobile electronic and computing devices. The drive to make these devices smaller has made reducing battery size and the size of associated battery compartments a priority. An issue with most batteries is that the batteries require space to expand and contract with the battery charging cycle and within which to swell over time. Electronic batteries are typically composed of battery cells. Individual battery cells used in most electronics tend to be cylindrical and expand and contract outwardly, especially from the circumference of the cells. Battery packs in most electronics are composed of a number of these cells, often arranged in substantially planar arrangements to allow for a narrower profile that fits better in electronics. For the purpose of this specification, the terms, "battery" and "battery pack" may be used interchangeably. Swelling of battery packs tends to be most problematic when it is orthogonal to the plane of the planar arrangement, challenging designers to compensate while maintaining a thin profile in mobile computing devices including, for example, laptops, tablets, hybrid 2-in-1 systems, and mobile phones.

Designing systems to provide extra space for battery expansion presents a number of disadvantages. For instance, the extra space is otherwise unused and makes the mobile devices containing the batteries larger. Further, the extra space can permit unintended movement of the battery during use and transportation. During regular expansion and contraction cycles the battery is given more freedom of movement than required and can be jostled, which leaves the battery more susceptible to damage from impacts to an associated mobile device.

An alternative to providing extra space for the battery expansion is to contain the battery with a flexible element that allows for expansion with time. Many of the components of a computing device benefit from the integrity rigidity provides. For instance, a frame of the device may be rigid to support and protect electronic components of the device. Also, manufacturing can be complicated if the substrate, such as a frame, to which components are coupled is too flexible.

Using a flexible closure member to close a battery compartment in a computing device may allow for a battery to expand and contract dynamically over the life of a computing device and its battery without occupying significantly more space than is necessary to accommodate the battery. The flexible closure member may also allow for the rest of the frame to be sufficiently rigid to provide support for other components and to oppose the flexible closure member to minimize the space occupied by the battery and its compartment in the device. The flexible closure member may also provide the desired flexibility while limiting manufacturing complexity.

Figure 1:
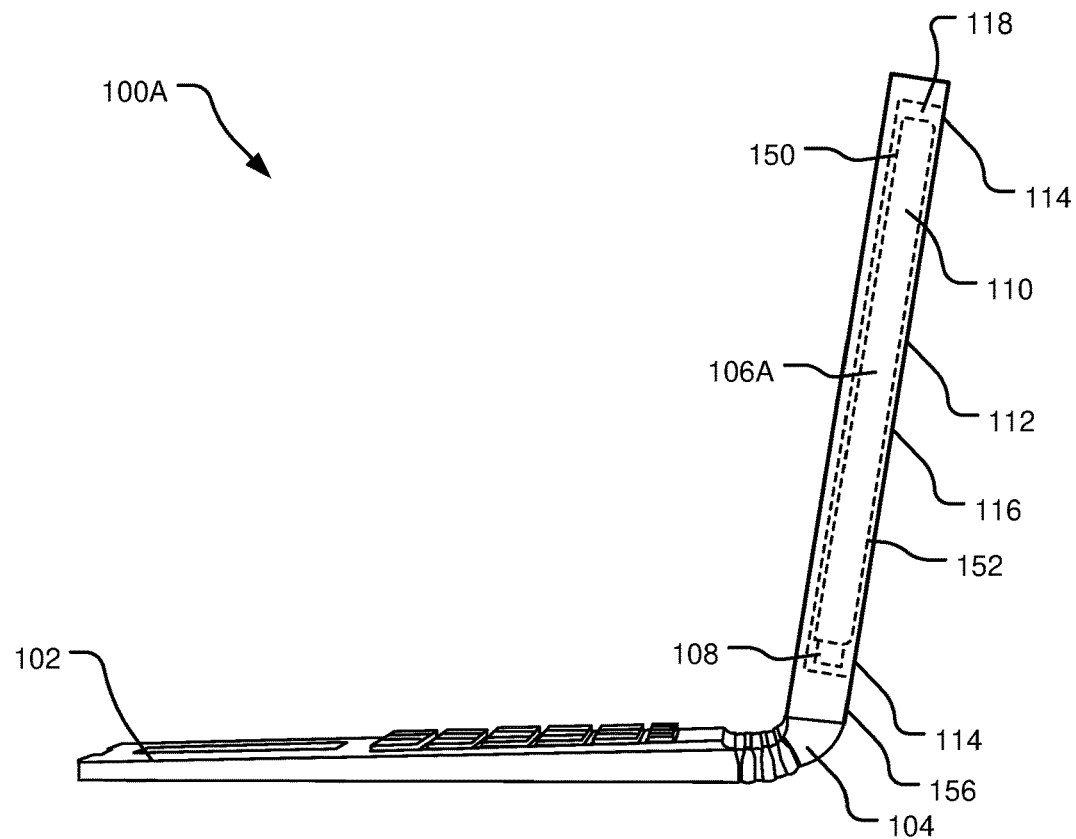
FIG. 1 illustrates an example of a computer system before use and after a period of use.
Figure 1:
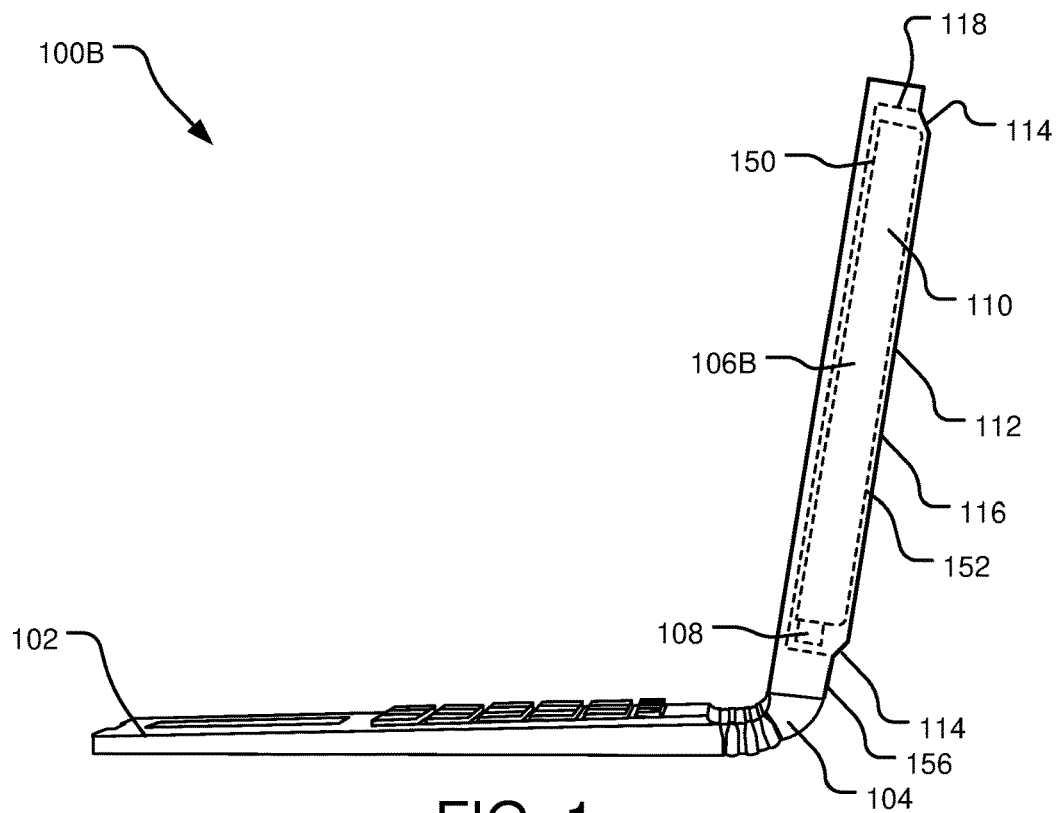

FIG. 1 illustrates an example of a computer system before use and after a period of use. The BEFORE USE scenario 100A is a demonstration of a relative appearance of the computing device 102 before it is used. The computing device 102 is any sort of computing device that uses a battery. For instance, the computing device 102 may be any of a laptop, tablet, 2-in-1 hybrid, mobile phone, and the like. The computing device 102 in the BEFORE USE scenario 100A has been manufactured but not used by a user or consumer.

The computing device 102 has a frame 104. The frame 104 is a rigid or predominantly rigid structure of the computing device 102 that holds components of the computing device 102. The frame 104 may provide integrity to ensure safety of components of the computer, for instance, one or more of a monitor/screen, motherboard, memory devices, and the like. The frame 104 may have a frame surface 156. The frame surface 156 is an external surface of the frame. The frame surface 156 would be the surface of the frame 104 of the computing device 102 that would be apparent to a user when the computing device 102 is fully manufactured. The frame 104 may further have a battery compartment 118. The battery compartment 118 is a rigid element of the frame that may provide rigid support for the battery 106A, 160B. The battery before use 106A is presented in the BEFORE USE scenario 100A and is a battery that has yet to be used by the computing device 102 (except, perhaps, for factory quality control and assurance and related pre-sale uses). The battery after use 106B is a battery after a user has used the computing device 102 and regular expansion has occurred in the battery 160B. The battery 106A, 160B may have a static battery element 108 and an expanding battery element 110. The static battery element 108 is an element of the battery 106A, 160B that does not expand over time. For instance, the static battery element 108 may not have battery cells that expand and contract with use. The static battery element 108 may include a battery board or other electronics that facilitate the use of the battery 106A, 106B. The expanding battery element 110 is an element of the battery 106A, 160B that expands with use. For instance, the expanding battery element 110 may include the battery cells that expand and contract with use. Although depicted as two discrete elements in FIG. 1, it should be appreciated that different arrangements and numbers of the static battery element 108 and expanding battery element 110 are contemplated, for instance, to account for different form factors of batteries and battery packs.

The battery 106A, 160B may have a first primary planar surface 150 and a second primary planar surface 152. The first primary planar surface 150 and second primary planar surface 152 are surfaces of the battery 106A, 160B. For the purposes of the specification a primary planar surface 150, 152 represents a largely planar surface created by a planar arrangement of the battery cells, perhaps in a battery pack. In an implementation, because the expanding battery element 110 expands while the static element 108 remains static, the first primary planar surface 150 and the second primary planar surface 152 may effectively be the surfaces of the expanding battery element 110. Although some battery packs are not placed in a rectangular prismatic or other shaped container, often being simply cells wrapped in a polymer in a planar arrangement having ridges defined by the circumferences of individual battery cells or other conformations, it should be appreciated that the larger, primary surfaces are often effectively parallel to one another and planar for the purposes of placement in a battery compartment. The primary planar surfaces of the battery 106A, 160B may be the largest, substantially planar surfaces of the battery pack formed by the planar arrangement of cells. Other types of batteries are also contemplated that have a relatively small profile, for instance, different cells that also have substantially flat and circular or other-shaped surfaces (e.g., coin and button batteries). The first primary planar surface 150 may be on an opposite side of the battery 106A, 160B from the second primary planar surface 152. The first primary planar surface 150 may engage an interior rigid back surface of the battery compartment 118. The battery compartment 118 may be closed using a closure member 112. While surfaces are used in this implementation, implementations are also contemplated where the elements of the frame 104 and the closure member 112 engage the battery 106A, 106B and flexibly expand with expansion of the battery are contemplated. The rigid back surface may be, for instance, an element of a frame 104 or midframe, a screen or monitor, a display, a touch display, a keyset, some intermediary, and the like. The rigid back surface may have properties or additional elements such as thermal paste or otherwise to prevent heat and/or pressure from the battery affecting the rigid back surface or something coupled thereto. If some type of display is the rigid back surface or is coupled to the rigid back sufficiently closely to the surface, materials may be inserted to prevent screen mura or color (e.g., yellow) banding. This may be more of an issue when the computing device 112 is a small mobile device.

The closure member 112 is an element that closes the battery compartment 118 and provides flexibility for battery 106A, 160B expansion and contraction. The closure member 112 may have a flexible portion 114 and a rigid portion 116. The flexible portion 114 is a portion of the closure member 112 that flexes to allow expansion of the battery 106A, 160B. The rigid portion 116 is a portion of the closure member 112 that is rigid and provides structure and protection of the battery 106A, 160B. The rigid portion 116 may be located centrally in the closure member 112, perhaps circumscribed by the flexible portion 114. Although depicted as having two elements of the flexible portion 114 in FIG. 1, this is a product of the two-dimensional rendering in FIG. 1. Implementations having multiple flexible portions 114 and/or multiple rigid portions 116 are contemplated.

The flexible portion 114 may be composed of any flexible material, for instance, one or more of rubber, fabric, silicone, other polymers, and the like. The flexible portion 114 may also be composed of or include in its composition a pierce-resistant substance to prevent piercing of the flexible portion 114. The pierce-resistant material may be any kind of material including, for instance, flexible polymers, polyparaphenylene terephthalamide, other aramids, other synthetic fibers, chain mail, other meshes, other materials with high tensile strength-to-weight ratios, and the like.

The rigid portion 116 may be at least partially composed of any rigid material, for instance, one or more of steel, carbon fiber, mesh, glass, copper, and the like. The rigid portion 116 may be arranged to contain and be adjacent to and cover the battery 106A, 160B. In an implementation, the rigid portion 116 closes, is adjacent to, and covers at least the expanding battery element 110. The rigid portion 116 and the flexible portion 114 may be arranged on the closure member 112 such that the rigid portion 116 engages and/or covers at least the entirety of the second primary planar surface of the battery 152 or the surface of the expanding element 110 during expansion and contraction of the battery 106A, 160B.

The flexible portion 114 may represent a band of flexible material that circumscribes the rigid portion 116. The closure member 112 may have a further band of rigid material (not depicted in FIG. 1) about the flexible portion 114. This further band of rigid material may be used as a coupling element to couple the closure member 112 to a periphery of the battery compartment 118. The flexible portion 114 may flex to allow extension of the rigid portion 116 away from the rigid back portion of the battery compartment 118. That is, the flexible portion 114 may flex to prevent bending, kinking or other malformation of the rigid portion 116 of the closure member 112.

A space between the rigid portion 116 and either a second band of rigid material or a coupling between the periphery of the closure member 112 and the periphery of the battery compartment 118 may be referred to herein as a gap (not shown in FIG. 1). The gap may be an element of or coincident with the flexible portion 116. The gap may be filled with air or may be filled with pierce-resistant material that prevents piercing of the flexible region 114. In an implementation in which the closure member 112 has two sheets of flexible material that surround a rigid sheet of material, the gap may simply be defined by a space between the two flexible sheets or may have the two sheets coupled to one another.

In the BEFORE USE scenario 100A, it can be seen that the battery before use 106A fits within the frame 104. In this implementation, the closure member 112 appears relatively flush with the frame surface 156. The flexible portion 114 is not flexed yet, because the battery before use 106A has yet to expand or contract from use. While the BEFORE USE scenario 100A is depicted in FIG. 1 as having the initial state with a closure member 112 that is substantially flush with the frame surface, it should be appreciated that the initial state may alternatively have the closure member 112 at least partially recessed within or external of the battery compartment 118.

In the AFTER USE scenario 100B, it can be seen that the expanding battery element 110 of the battery after use 106B has expanded such that the battery is partially external of the battery compartment 118 of the frame 104. The after use battery 106B has expanded to the point where it is no longer flush with and even protrudes from the frame surface 156. The flexible portion 114 of the closure member 112 has flexed to allow the rigid portion 116 of the closure member 112 to extend away from the rigid back of the battery compartment 118 and accommodate the expanding battery element 110 of the battery after use 106B. In an implementation, the rigid portion 116 of the closure member 112 covers the second primary planar surface 152 of the after use battery 106B. The battery 106A, 106B may be situated with respect to the battery compartment 118 and the closure member 112 such that, before use in the BEFORE USE scenario 100A and after use in the AFTER USE scenario 100B, there remains no meaningful gap between the first primary planar surface 150 (at least the surface of the expanding battery element 110) and the rigid back of the battery compartment 118 and no meaningful gap between the second primary planar surface 152 (at least the surface of the expanding battery element 110) and closure member 112.

Various implementations are contemplated with respect to the manner in which the battery 106A, 106B is accommodated within the battery compartment 118 and the closure member 112. For instance, in one implementation, the battery 106A, 106B is affixed or adhered to one or more of the rigid back surface of the battery compartment 118 at the first primary planar surface 150, the rigid portion 116 of the closure member 112 at the second primary planar surface 152, a side of the battery compartment 118, and the like. Although not depicted, the battery may be set or coupled in an intermediary cradle or other structure to facilitate coupling and/or securing the battery 106A, 106B into the battery compartment 118. The battery 106A, 106B may be attached or affixed by screws, adhesive, pressure fit, and any other methods known in the art. In an implementation, the battery 106A, 106B may be merely adjacent and/or in contact with one or more of the rigid back surface of the battery compartment 118 and the closure member 112.

While not shown in FIG. 1, implementations are contemplated in which the extension of the rigid portion 116 away from the rigid back surface is limited. For instance, this may be accomplished by controlling the size and composition of the flexible portion 114 to limit the extent to which the flexible portion 114 may flex. The limit may be expressed as a predetermined amount the rigid portion 116 may extend from its original position relative to the rigid back surface of the battery compartment 118. The predetermined amount may be relative to a width of the battery before use 106A, the width determined as the width between the first primary planar surface 150 and the second primary planar surface 152 of the battery before use 106A. The predetermined amount may be, for instance, one of 1%, 2%, 3%, 4%, 5%, 6%, 7%, 8%, 9%, 10%, 11%, 12%, 13%, 14%, 15%, 16%, 17%, 18%, 19%, or 20% or any range between those percentages including, for instance, one of 1-3%, 1-20%, 1-15%, 7-8%, 7-13%, 7-15%, 8-12%, 8-13%, 8-15%, 9-11%, 9-15%, 10-15% 10-20%, and the like. The closure member and/or the frame may also have other limiting structures, for instance, further rigid elements that prevent extension of the closure member beyond the frame surface.

Figure 2:
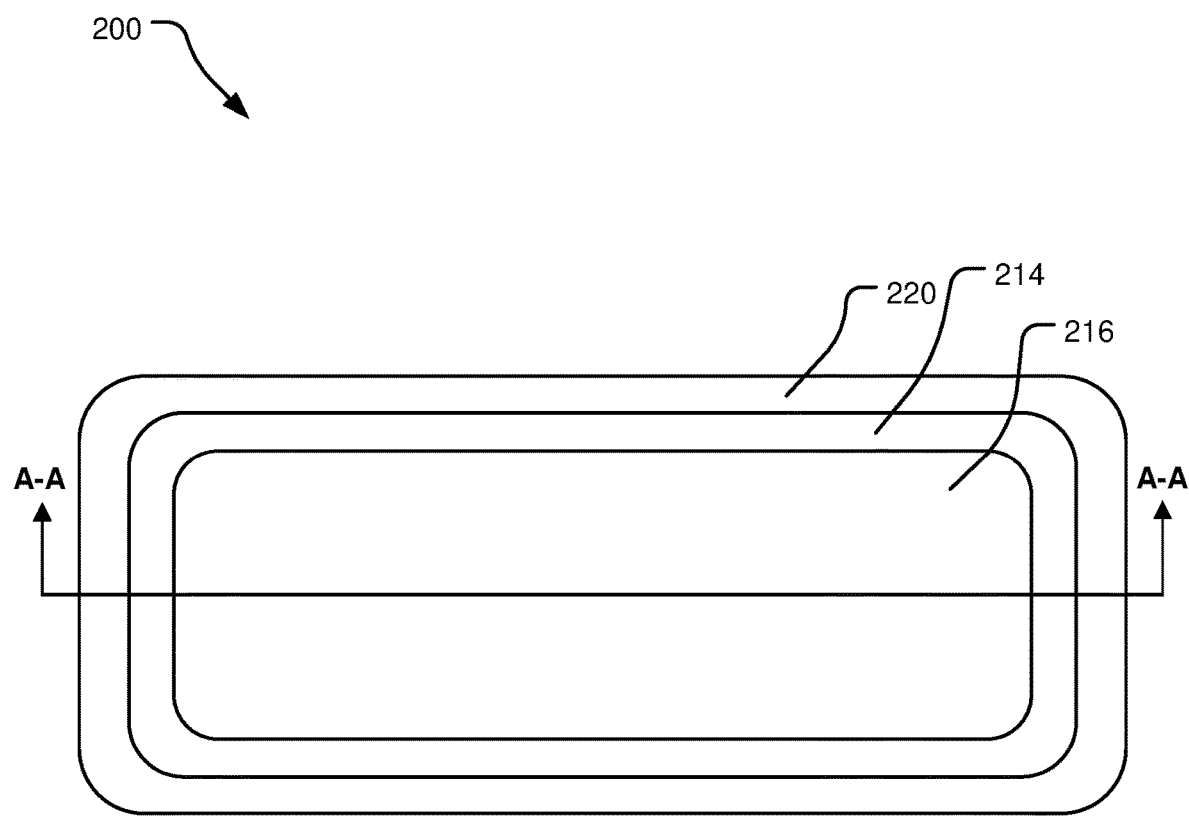
FIG. 2 illustrates a top view of an example of a closure member.

FIG. 2 illustrates a top view of an example of a closure member. The flexible portion 214 may be an implementation of the flexible portion 114, and the rigid portion 216 may be an implementation of the rigid portion 116. The exterior rigid band 220 is a rigid that circumscribes the flexible portion 214. The exterior rigid band may be used to couple the closure member 200 to a periphery of a battery compartment and/or provide further integrity to the closure member. The flexible portion 214 may represent a flexible band surrounding the rigid portion 216 and optionally surrounded by the exterior rigid band 220. While the implementations in FIG. 2 only show a single flexible band, having more alternating rigid and flexible bands is contemplated. For instance, an accordion style alternating between rigid and flexible bands is contemplated. The arrows having the "A-A" represent an orientation of the closure member 200 of FIG. 2 relative to the closure members 300A and 300B presented in FIGS. 3A and 3B.

Figure 3A:
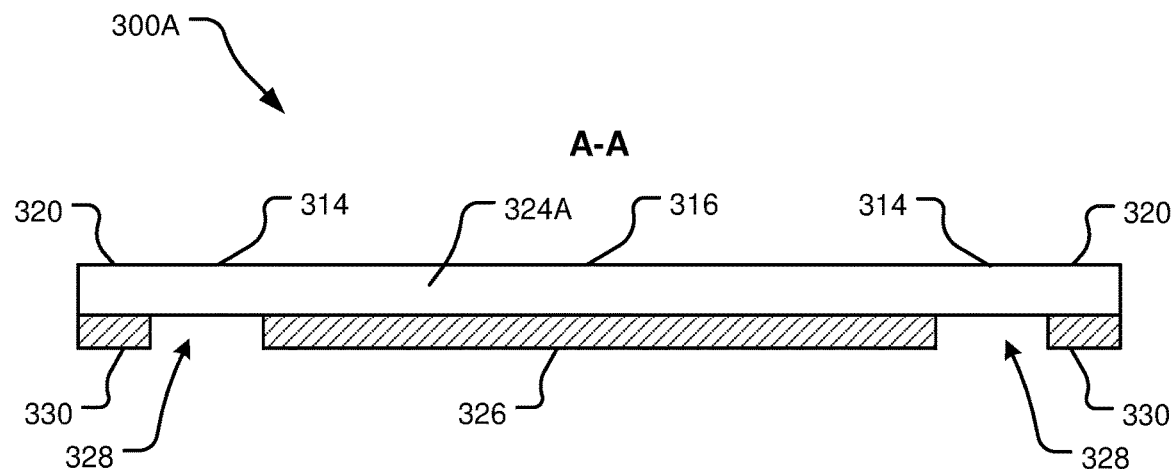
FIG. 3A illustrates a side view of an example closure member having a single flexible sheet.

FIG. 3A illustrates a side view of an example of a closure member having a single flexible sheet. The closure member 300A, the flexible portion 314, the rigid portion 316, and the exterior rigid band 320 may be implementations of closure member 112, the rigid portion 114, the flexible portion 116, and the exterior rigid band 220, respectively. The first sheet of flexible material 324A is a sheet of material that is flexible. The first sheet of flexible material 324A has a planar surface that may be coupled to a planar surface of the sheet of rigid material 326. The sheet of rigid material 326 is a sheet of material that is rigid. The area of the closure member 300A where the first sheet of flexible material 324A is coupled to the sheet of rigid material 326 may define a rigid portion 316 of the closure member. The part of the first sheet of flexible material 324A that is not coupled to a rigid portion, for instance, either of the sheet of rigid material 326 or the rigid element 330, may define a flexible band that represents the flexible portion 314. The exterior rigid band 330 may be defined by a rigid element 320 coupled to at least the first sheet of flexible material 324A, circumscribing the sheet of rigid material 326. The interior of the exterior rigid band 330 may define an outer perimeter of the flexible portion 314. The gap 328 is a gap between rigid elements of the closure member 300A. The gap 328 may be coincident with the flexible portion 314. The gap 328 may be filled with a pierce-resistant substance or may be air. Alternatively or additionally, the first sheet of flexible material may be composed of materials that have pierce-resistant properties. While the first sheet of flexible material 324A is described and depicted as a single sheet of material, it should be appreciated that this flexible sheet may be composed of a number of stacked or otherwise coupled sheets of the same material or different materials.

Figure 3B:
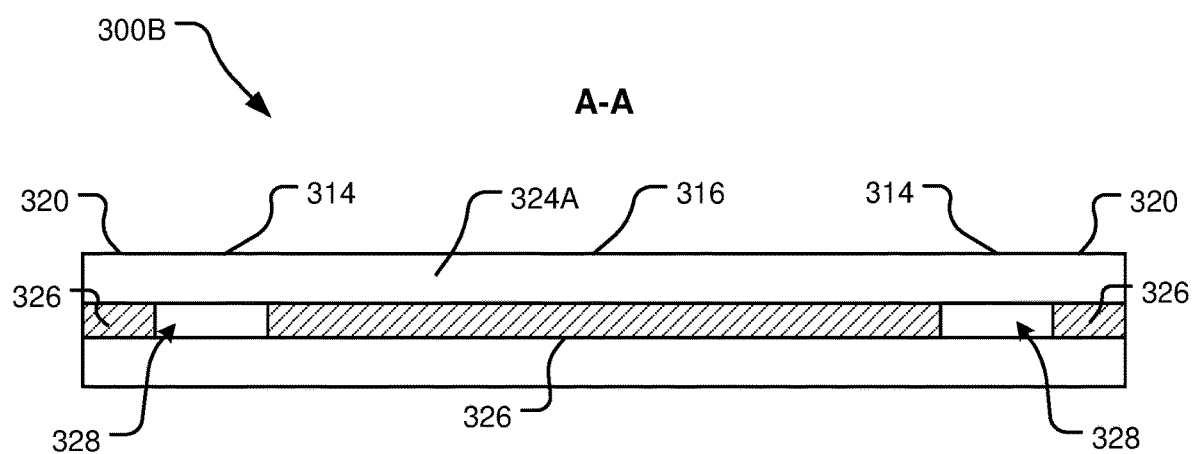
FIG. 3B illustrates a side view of another example closure member having two flexible sheets.

FIG. 3B illustrates a side view of another example of a closure member having two flexible sheets. In this implementation, the second sheet of flexible material 324B is coupled to an opposite side of the sheet of rigid material 326 relative to the first sheet of flexible material 324A. The sheets of flexible material 324A, 324B may have substantially the same surface area and may be coupled to rigid materials such as the sheet of rigid material 326 and the rigid element 330 at the complementary positions on opposite sides of the rigid materials. The gaps 328 in closure member 300B may be defined by the space between the flexible sheets 324A, 324B, the space perhaps being occupied by air or pierce-proof material. Alternatively, the gaps may simply have the two flexible sheets 324A, 324B coupled to one another.

Figure 4A:
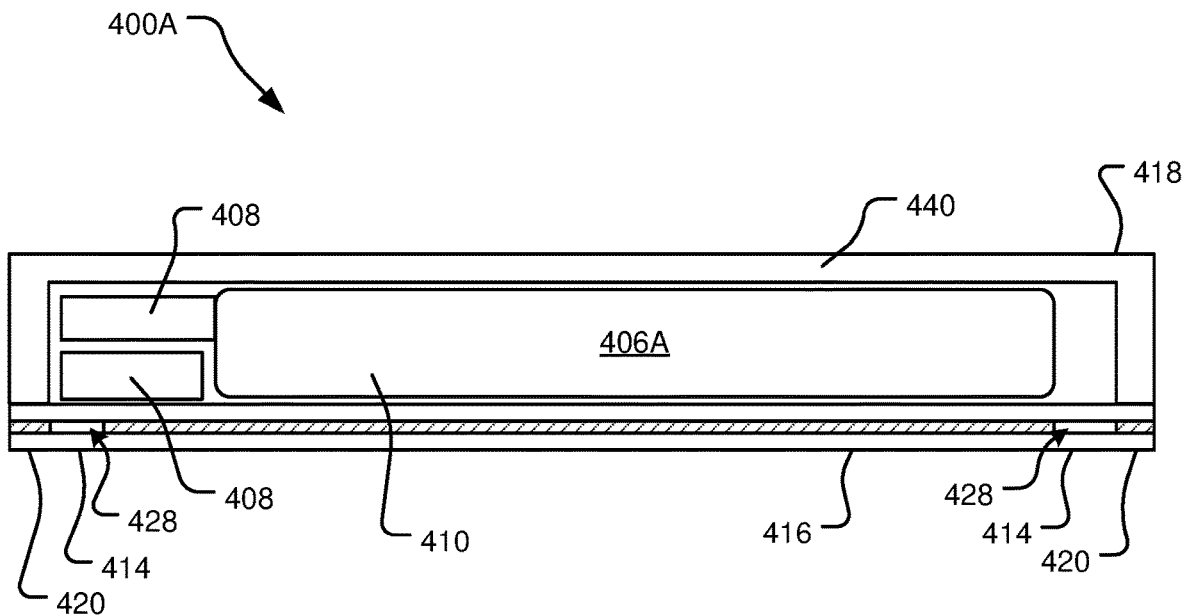
FIG. 4A illustrates an example system for containing a battery prior to use in a computing device that begins flush with a frame surface.
Figure 4B:
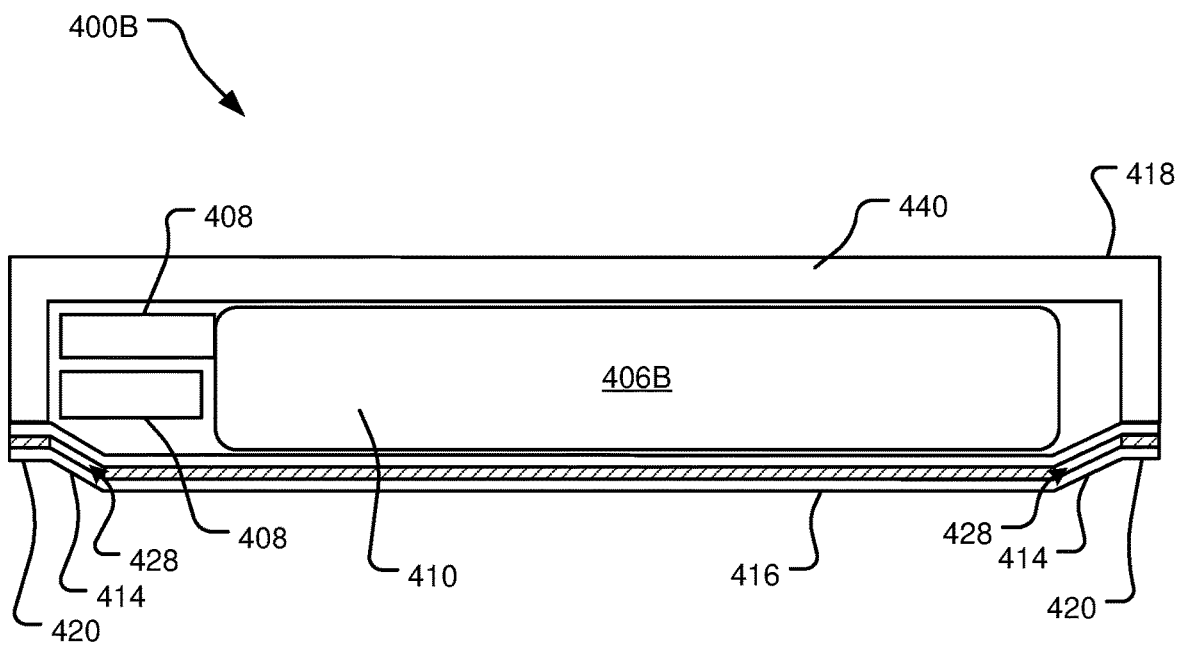
FIG. 4B illustrates an example system for containing a battery after use in a computing device that extends beyond a frame surface.

FIGS. 4A and 4B illustrate an implementation where a closure member that is substantially flush with a frame surface of the computing device and is allowed to extend outwardly to be as shown with the closure member to accommodate battery expansion. More specifically, FIG. 4A illustrates an example of a system 400A for containing a battery prior to use in a computing device that begins flush with a frame surface. FIG. 4B illustrates an example of a system 400B for containing a battery after use in a computing device that extends beyond a frame surface.

The system 400A has a battery before use 406A, and the system 400B has a battery after use 406B. The battery before use 406A and the battery after use 406B may be implementations of the battery before use 106A and battery after use 106B, respectively. The implementations of FIGS. 4A and 4B may have static battery elements 408, an expanding battery element 410, a flexible portion 414, a rigid portion 416, a battery compartment 418, an rigid band 420, and a gap 428, which may be implementations of the static battery element 108, the expanding battery element 110, the flexible portion 114, the rigid portion 116, the battery compartment 118, the rigid band 220, and the gap 228, respectively. The battery compartment 118 may further have a rigid back surface 440. The rigid back surface 440 is a rigid back surface of the battery compartment that opposes battery expansion. The rigid back surface 440 may be adjacent to, in contact with, or even adhered to the battery 406A, 406B. The rigid back surface 440 may be sufficiently rigid to oppose expansion of the battery 406A, 406B to compel the battery to expand away from the rigid back surface 440 and into the flexible closure member.

As can be seen in FIGS. 4A and 4B, the expanding battery element 410 of the battery before use 406A expands to be the expanding battery element 410 of the battery after use 406B. This pushes the closure member away from the rigid back surface 440 of the battery compartment 418. The flexible portion 414 flexes to allow the rigid portion 416 to extend away from the rigid back surface 440 of the battery compartment 418. This results in the rigid portion 116 moving from being flush with a frame surface, as shown in FIG. 4A, to extending outwardly from a frame surface, as shown in FIG. 4B.

Figure 5A:
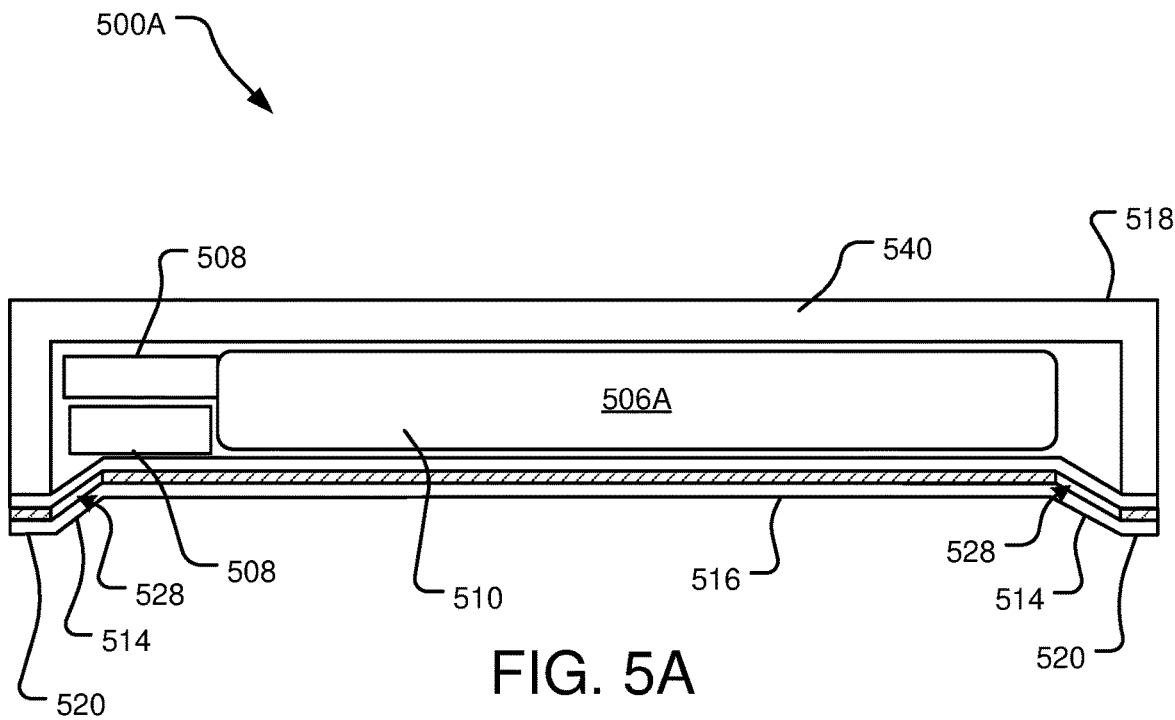
FIG. 5A illustrates an example system for containing a battery prior to use in a computing device that begins recessed within a frame.
Figure 5B:
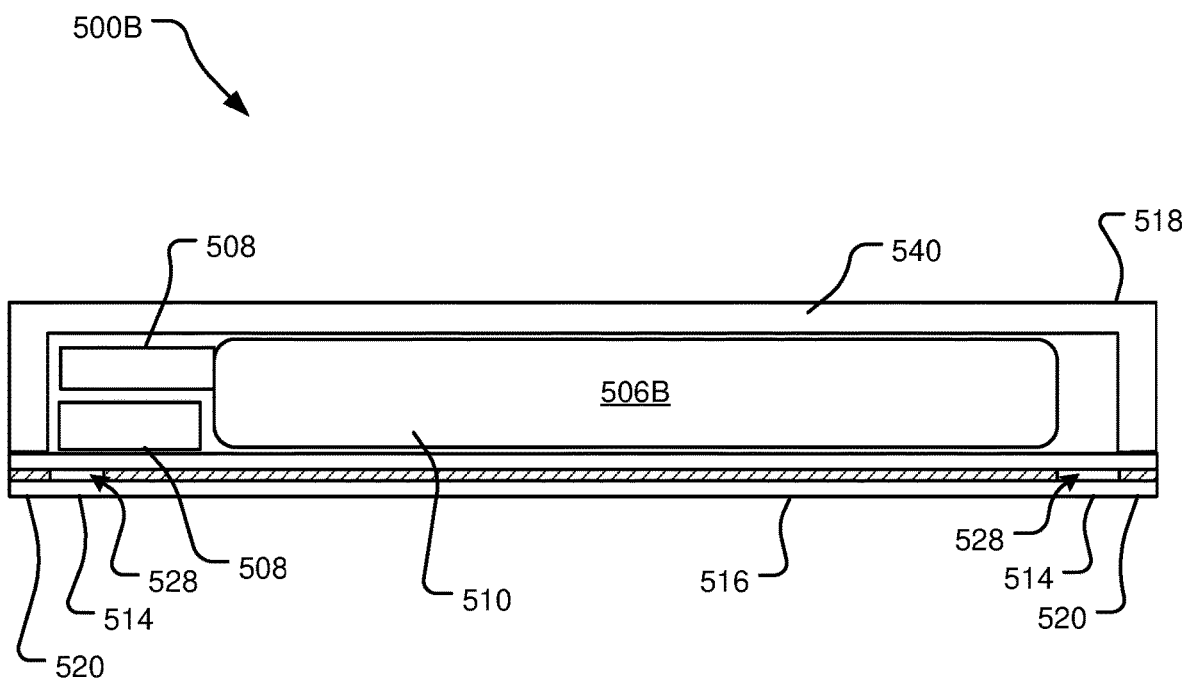
FIG. 5B illustrates an example system for containing a battery after use in a computing device that ends flush with a frame surface.

FIGS. 5A and 5B illustrate an implementation where a closure member begins recessed within a battery compartment of a frame of a computing device and is allowed to extend outwardly such that the closure member is substantially flush with a frame surface to accommodate battery expansion. More specifically, FIG. 5A illustrates an example of a system for containing a battery prior to use in a computing device that begins recessed within a frame. FIG. 5B illustrates an example of a system for containing a battery after use in a computing device that ends flush with a frame surface.

The system 500A has a battery before use 506A, and the system 500B has a battery after use 506B. The battery before use 506A and the battery after use 506B may be implementations of the battery before use 106A and battery after use 106B, respectively. The implementations of FIGS. 5A and 5B may have static battery elements 508, an expanding battery element 510, a flexible portion 514, a rigid portion 516, a battery compartment 518, an rigid band 520, a gap 528, and a rigid back surface 540, which may be implementations of the static battery element 108, the expanding battery element 110, the flexible portion 114, the rigid portion 116, the battery compartment 118, the rigid band 220, the gap 228, and the rigid back surface 440, respectively.

As can be seen in FIGS. 5A and 5B, the expanding battery element 510 of the battery before use 506A expands to be the expanding battery element 510 of the battery after use 506B. This pushes the closure member away from the rigid back surface 540 of the battery compartment 518. The flexible portion 514 flexes to allow the rigid portion 516 to extend away from the rigid back surface 540 of the battery compartment 518. This results in the rigid portion 516 extending outwardly from being recessed within a battery compartment 518, as shown in FIG. 5A, to being substantially flush with a frame surface, as shown in FIG. 5B.

Figure 6A:
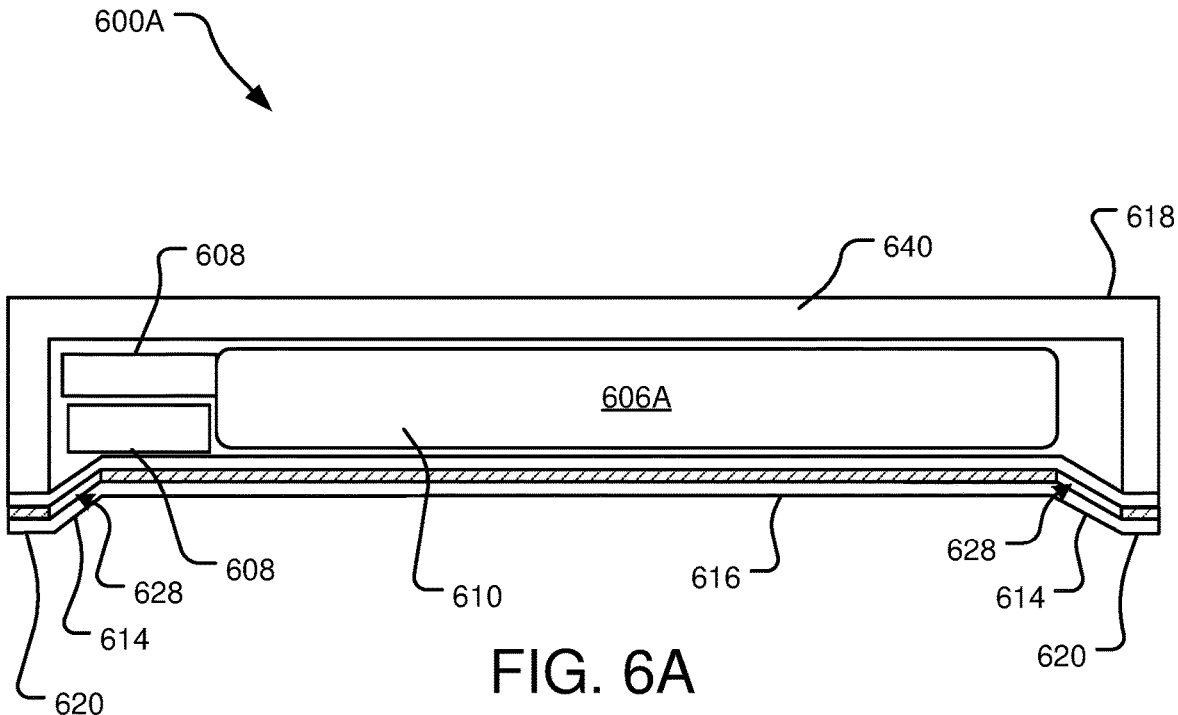
FIG. 6A illustrates another example system for containing a battery before use in a computing device that begins recessed within a frame.
Figure 6B:
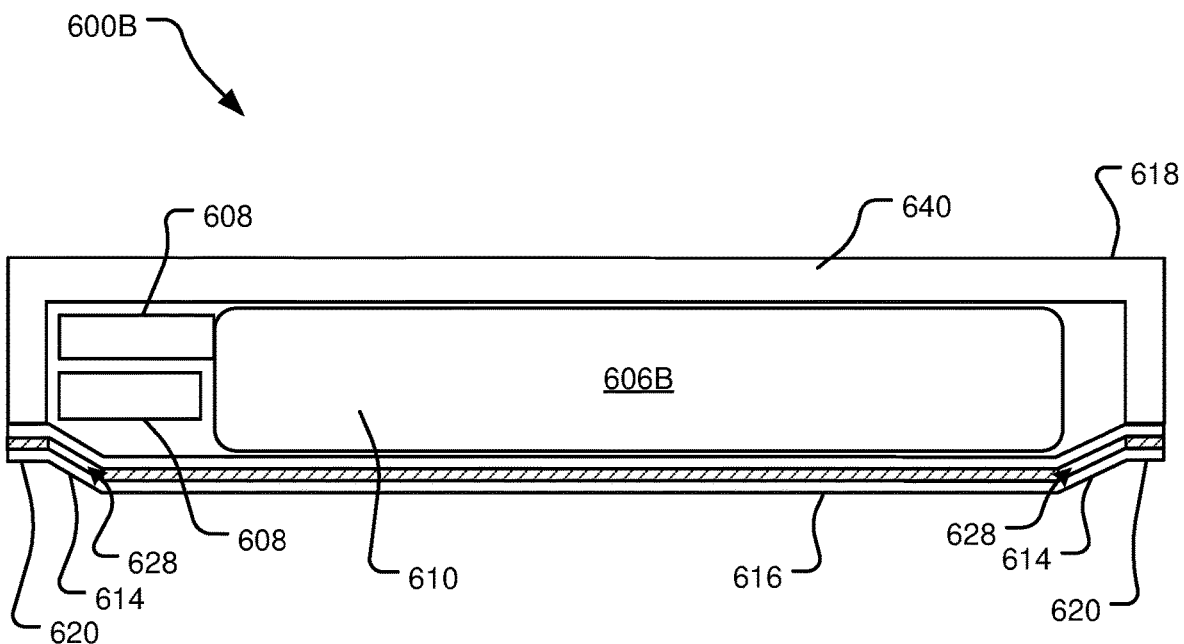
FIG. 6B illustrates another example system for containing a battery after use in a computing device that extends beyond a frame surface.

FIGS. 6A and 6B illustrate an implementation where a closure member begins recessed within a battery compartment of a frame of a computing device and is allowed to extend outwardly from a frame surface to accommodate battery expansion. More specifically, FIG. 6A illustrates another example of a system 600A for containing a battery before use in a computing device that begins recessed within a frame. FIG. 6B illustrates another example of a system 600B for containing a battery after use in a computing device that extends beyond a frame surface.

The system 600A has a battery before use 606A, and the system 600B has a battery after use 606B. The battery before use 606A and the battery after use 606B may be implementations of the battery before use 106A and battery after use 106B, respectively. The implementations of FIGS. 6A and 6B may have static battery elements 608, an expanding battery element 610, a flexible portion 614, a rigid portion 616, a battery compartment 618, an rigid band 620, a gap 628, and a rigid back surface 640 which may be implementations of the static battery element 108, the expanding battery element 110, the flexible portion 114, the rigid portion 116, the battery compartment 118, the rigid band 220, the gap 228, and the rigid back surface 440, respectively.

As can be seen in FIGS. 6A and 6B, the expanding battery element 610 of the battery before use 606A expands to be the expanding battery element 610 of the battery after use 606B. This pushes the closure member away from the rigid back surface 640 of the battery compartment 618. The flexible portion 614 flexes to allow the rigid portion 616 to extend away from the rigid back surface 640 of the battery compartment 618. This results in the rigid portion 616 moving from being recessed within a battery compartment 618, as shown in FIG. 6A, to extending outwardly from the frame surface, as shown in FIG. 6B.

Figure 7:
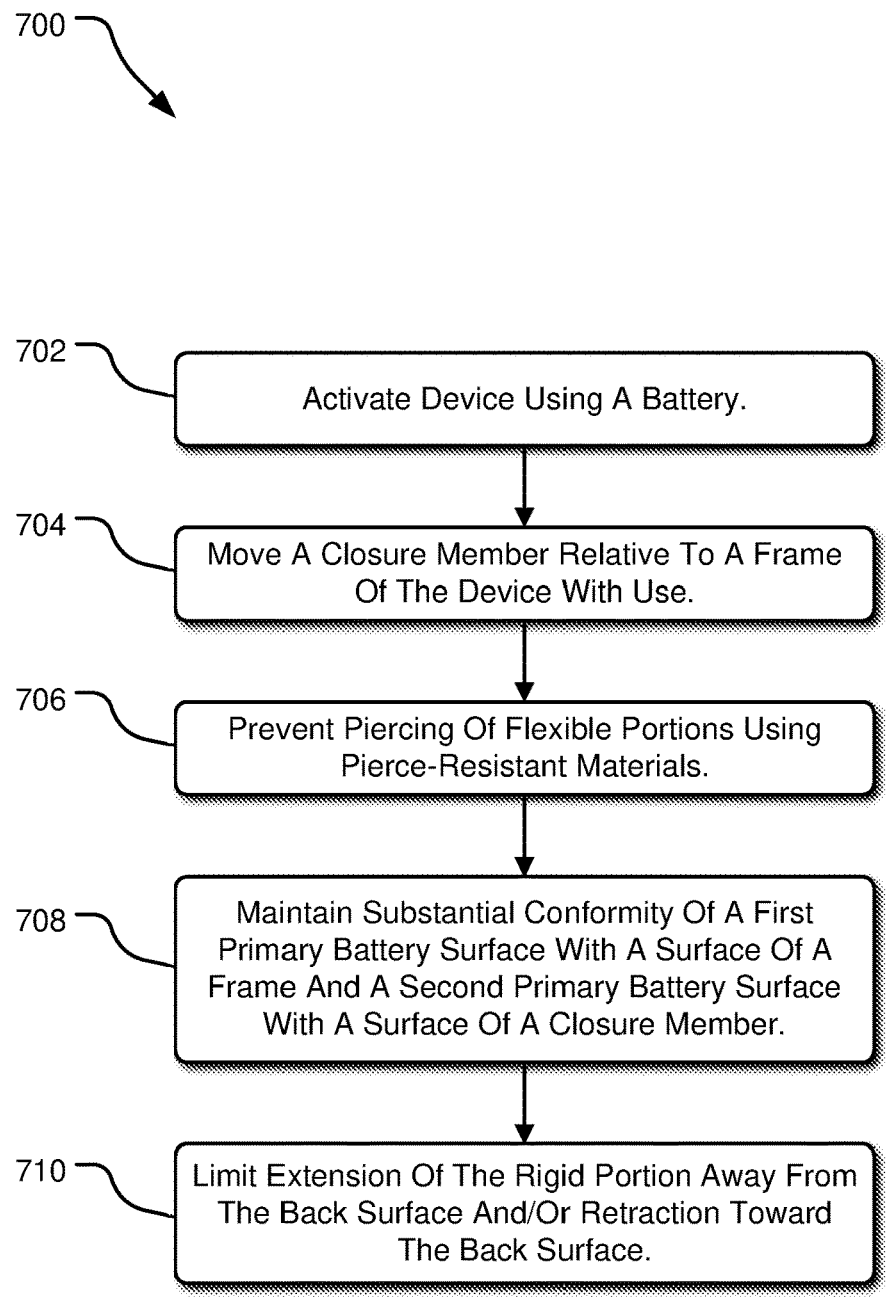
FIG. 7 illustrates an example method of battery containment within a computing device.

FIG. 7 illustrates a flowchart of an example of a method 700 of use of a system for containing a battery in a computing device. Activating operation 702 activates a computing device using a battery. The computing device may have a frame with a battery compartment and a frame surface. The battery compartment may have a rigid back surface to resist battery expansion in the direction of the rigid back surface. The computing device may have a closure member to close the battery compartment, the closure member having flexible and rigid portions to allow for expansion of the battery while still maintaining protection for the battery. The flexible closure member may allow for the primary planar surfaces of the battery to remain adjacent to or even in contact with one or more of the closure member and the rigid back surface of the battery compartment as the battery expands and contracts. In an implementation, the flexibility provided by the closure member may allow the primary planar surfaces of the battery to be adhered or coupled (e.g., using thermal paste) directly to one or more of the closure member and the rigid back surface of the battery compartment.

Moving operation 704 moves the closure member relative to elements of the frame with use of the computing device. The flexible portion of the closure member may flex to allow the rigid portion of the closure member to move from an initial position to a different position relative to a rigid back surface of the battery compartment. Positions of the closure member contemplated, whether before or after use, may include one or more of the closure member being recessed within a battery compartment, substantially flush with a frame surface, and extending outwardly from the frame surface. In an implementation, the moving may include extending, by flexing the flexible portion of the closure member, the closure member (or rigid portion of the closure member) away from the rigid back of the surface of the battery compartment when the battery expands. In an implementation, the moving may include retracting, by flexing the flexible portion of the closure member, the closure member (or rigid portion of the closure member) towards the rigid back of the surface of the battery compartment when the battery contracts.

In implementations, the method may also include a preventing operation 706 that prevents piercing of the flexible portion of the closure member using pierce-resistant material in the flexible portion. Implementations are contemplated where no such pierce-resistant structures are included in the closure member, perhaps making the preventing operation 706 optional.

Maintaining operation 708 that maintains substantial conformity of a first primary planar surface of the battery with a rigid back surface of a recessed battery compartment of a frame of the computing device and/or maintains substantial conformity of a second primary planar surface of the battery with a surface of the closure member. Implementations are contemplated in which intermediate elements exist between the battery and the closure member and/or the battery compartment, such that the conformity will be with other intermediate elements, perhaps making the maintaining operation 708 optional.

In implementations, the method may also include a limiting operation 710 that limits the extension of the rigid portion away from the rigid back surface of the battery compartment and/or retraction of the rigid portion towards the rigid back surface of the battery compartment. The flexible portions may be limited to members flexing to allow a rigid portion of the closure member to extend away relative to a rigid back surface of the recessed battery compartment from an original position of the rigid portion to a further predetermined amount of the battery's width, where the battery's width is a distance between a first primary planar surface of the battery and a second primary planar surface of the battery. The predetermined amount may be, for instance, one of 1%, 2%, 3%, 4%, 5%, 6%, 7%, 8%, 9%, 10%, 11%, 12%, 13%, 14%, 15%, 16%, 17%, 18%, 19%, or 20% or any range between those percentages including, for instance, one of 1-3%, 1-20%, 1-15%, 7-8%, 7-13%, 7-15%, 8-12%, 8-13%, 8-15%, 9-11%, 9-15%, 10-15% 10-20%, and the like. Implementations are contemplated where no such limiting structures are included in the closure member and/or the computing device, perhaps making the restricting operation 710 optional.

In an implementation, each of the operations of the method 700 shown in FIG. 7 is a distinct operation. In another implementation, although depicted as distinct operations in FIG. 7, operations 702-710 may not be distinct operations. In other implementations, the method 700 shown in FIG. 7 may not have all of the above operations and/or may have other operations in addition to or instead of those listed above. The operations of the method 700 shown in FIG. 7 may be performed in another order. Subsets of the operations listed above as part of the method 700 shown in FIG. 7 may be used to form their own method. The operations of method 700 may be repeated in any combination and order any number of times, for instance, continuously or selectively looping in order to allow for continuous conformity of the closure member and the rigid back surface of the battery compartment with the primary planar battery surfaces when the battery expands and/or contracts.

Figure 8:
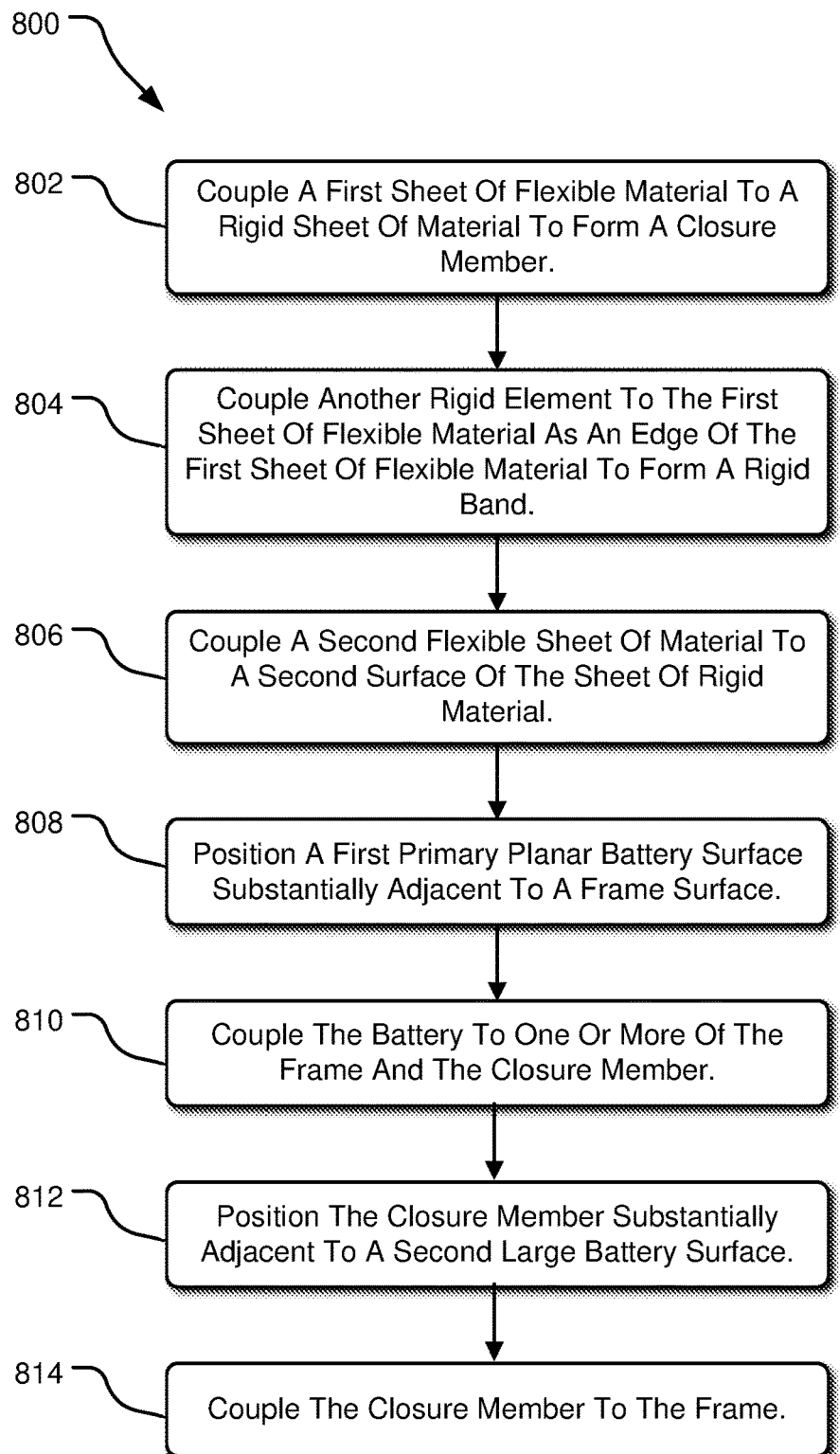
FIG. 8 illustrates an example method of making a system for containing a battery in a computing device.

FIG. 8 illustrates a flow chart of an example of a method of making a system for containing a battery in a computing device. Coupling operation 802 couples a surface of a first sheet of flexible material with a surface of a sheet of rigid material to form a closure member. The surface area of the surface of the first sheet of flexible material may be larger than the surface area of the surface of the sheet of rigid material. After coupling, the surface of the first sheet of flexible material that is not coupled may circumscribe the surface of the first sheet of flexible material that is coupled, perhaps forming a flexible band or flexible portion. The coupled portion may be made rigid by the sheet of rigid material and may define a rigid portion. The coupling 802 may be accomplished by one or more of laminating, adhering (e.g., by applying adhesive), melting, sewing, weaving, and the like.

Coupling operation 804 couples another rigid element to the first sheet of flexible material at an edge of the first sheet of flexible material to form a rigid band. The rigid element may be formed by cutting away rigid material from a rigid sheet of material such that there is a hole in the rigid material sufficient to circumscribe the coupled sheet of rigid material. Alternatively, the rigid element may be molded, extruded or differently cut to form a similar conformation. The rigid element may be coupled to the edge of the first flexible sheet of material such that the coupled rigid element circumscribes the sheet of rigid material. When the rigid element is coupled to the edge of the first sheet of flexible material, there may be a gap between the rigid element and the sheet of rigid material about the periphery of the sheet of rigid material, the gap perhaps an element of a flexible portion of the closure member. The gap may be air, or an absence of material between the rigid band and the rigid portion. The gap may alternatively or additionally be filled with a pierce-resistant material to prevent piercing of the flexible region or may have the two sheets of flexible material coupled to one another. The coupling 804 may be accomplished by one or more of laminating, adhering (e.g., by applying adhesive), melting, sewing, weaving, and the like. Implementations are contemplated where the steps 802-804 are repeated in order to make a series of alternating flexible bands and rigid bands, perhaps like an accordion. In implementations, coupling operation 804 may be optional depending on whether the closure member is an implementation with an exterior rigid band.

Coupling operation 806 couples a second sheet of flexible material to a second surface of the sheet of rigid material. The second surface of the sheet of rigid material may be on an opposite side of the surface of the sheet of rigid material to which the first sheet of flexible material is coupled. The second sheet of flexible material may be coupled to the sheet of rigid material at a position on the second surface of the sheet of rigid material that corresponds to a position on the surface of the sheet of rigid material to which the first sheet of flexible material is coupled. In implementations where the coupling operation 804 is conducted, the second sheet of flexible material may further be coupled to the rigid element, perhaps on an opposite side of the rigid element. In these implementations, the second sheet of flexible material may be coupled to the first sheet of flexible material at corresponding positions on the rigid element. There may be a gap between the rigid element and the sheet of rigid material, the gap perhaps having air, a pierce resistant material, another material, or being a further direct coupling between the first and second sheets of flexible material. The portion of the formed closure member at which the sheet of rigid material is coupled to the sheets of flexible material may be a rigid portion of the closure member. The portion of the formed closure member at which the rigid element is coupled (e.g., at an edge of the closure member) to the sheets of flexible material may be a rigid band. The portion of the closure member between the rigid portion and the rigid band may be a flexible portion or band. The coupling 806 may be accomplished by one or more of laminating, adhering (e.g., by applying adhesive), melting, sewing, weaving, and the like. Implementations are contemplated where the steps 802-806 are repeated in order to make a series of alternating flexible bands and rigid bands, perhaps like an accordion. Also, the flexible portion itself or the flexible material used in the flexible sheets may have such alternating or otherwise structures. In implementations, coupling operation 806 may be optional depending on, for instance, whether the coupling member is an implementation with two flexible sheets.

Positioning operation 808 positions a first primary planar battery surface substantially adjacent to a frame surface. The frame surface may be a rigid back surface of a battery compartment. The positioning may be such that the first primary planar battery surface contacts the rigid back surface of the battery compartment. The positioning may be such that the first primary planar surface is very close and adjacent to the rigid back surface, leaving almost no gap between the rigid back surface and the first primary planar battery surface. In an implementation of the positioning operation, the first primary planar battery surface may be partially or completely directly coupled or adhered to the rigid back surface, perhaps using screws, pressure fit, thermal paste, or other adhesive. The battery may also be coupled to a side of the battery compartment or in a cradle, such that, at least initially, there is a small but insubstantial gap between the first primary planar surface of the battery and the rigid back surface of the battery compartment. In various implementations, positioning operation 808 may be optional depending, for instance, on whether the manufacturer is responsible for securing the battery in a computing device in addition to manufacturing the closure member or whether there is an intermediate between the battery and the battery compartment.

Coupling operation 810 couples the battery to one or more of the frame and the closure member. The battery may be coupled to an element of the battery compartment. For instance, the battery may be coupled to a side of the battery compartment, may be coupled to an intermediate structure (e.g., a cradle or other attachment element), or may be coupled directly to the rigid back surface of the battery compartment. In an implementation the first primary battery surface is adhered directly to the rigid back surface of the battery compartment. The battery may additionally or alternatively be coupled to the closure member. For instance, the second primary planar surface may be coupled or adhered to the rigid portion of the closure member. In an implementation, all or a portion of the second primary planar surface that is the surface of an expanding battery element of the battery is coupled to all or a portion of the rigid portion of the closure member. Coupling operation 810 may couple using screws, pressure fit, thermal paste, or other adhesive. In implementations, coupling operation 810 may be optional depending, for instance, on whether the manufacturer is responsible for securing the battery in a computing device in addition to manufacturing the closure member.

Positioning operation 812 positions the battery substantially adjacent to the closure member. In implementations, the battery is directly coupled to the closure member. The closure member may alternatively be merely positioned substantially adjacent to the second primary planar surface of the battery. In an implementation, the second primary planar surface may be substantially defined by the expanding battery element and may directly or closely (perhaps with some insubstantial intermediate) conform to the closure member. The second primary planar surface of the battery may have this adjacency or coupling with all or a portion of the rigid portion of the closure member. In implementations, positioning operation 812 may be optional depending, for instance, on whether the manufacturer is responsible for securing the battery in a computing device in addition to manufacturing the closure member.

Coupling operation 814 couples the closure member to the frame. The closure member may be coupled to the frame by coupling the peripheral edge or perimeter of the closure member to a peripheral edge or perimeter of the battery compartment. In implementations where the closure member has a rigid band, the peripheral edge or perimeter of the rigid band may be coupled to the peripheral edge or perimeter of the battery compartment. Coupling 814 may completely or partially close the battery compartment to provide a container for the battery. Coupling 814 may be done such that the closure member may have an initial position, for instance, recessed in a battery compartment, substantially flush with a frame surface, or extended outwardly from the frame surface. In an implementation, the coupling 814 leaves sufficient surface area of the surface of the flexible material uncoupled to a rigid structure to flex to allow a rigid portion of the closure member to extend away relative to a rigid back surface of the recessed battery compartment from an original position of the rigid portion to a further predetermined amount of the battery's width, where the battery's width is a distance between a first primary planar surface of the battery and a second primary planar surface of the battery. The predetermined amount may be, for instance, one of 1%, 2%, 3%, 4%, 5%, 6%, 7%, 8%, 9%, 10%, 11%, 12%, 13%, 14%, 15%, 16%, 17%, 18%, 19%, or 20% or any range between those percentages including, for instance, one of 1-3%, 1-20%, 1-15%, 7-8%, 7-13%, 7-15%, 8-12%, 8-13%, 8-15%, 9-11%, 9-15%, 10-15% 10-20%, and the like.

Coupling operation 814 yields a flexible battery containing system, the flexibility to allow the contained battery to expand and contract without requiring extra gaps between the battery and the battery compartment and closure member. The flexible battery containing system can expand and contract to accommodate battery charging cycles and can accommodate battery expansion over the lifecycle of the battery in the computing device. In implementations, coupling operation 814 may be optional depending, for instance, on whether the manufacturer is responsible for securing the battery in a computing device in addition to manufacturing the closure member.

In an implementation, each of the operations of the method 800 shown in FIG. 8 is a distinct operation. In another implementation, although depicted as distinct operations in FIG. 8, operations 802-814 may not be distinct operations. In other implementations, the method 800 shown in FIG. 8 may not have all of the above operations and/or may have other operations in addition to or instead of those listed above. The operations of the method 800 shown in FIG. 8 may be performed in another order. Subsets of the operations listed above as part of the method 800 shown in FIG. 8 may be used to form their own method. The operations of method 800 may be repeated in any combination and order any number of times, for instance, continuously or selectively looping in order to produce any number of battery containing systems or to produce battery containing systems with multiple alternating rigid and flexible bands.

The logical operations making up embodiments of the invention described herein may be referred to variously as operations, steps, objects, or modules. Furthermore, it should be understood that logical operations may be performed in any order, adding or omitting operations as desired, regardless of whether operation are labeled or identified as optional, unless explicitly claimed otherwise or a specific order is inherently necessitated by the claim language.

An example computing device is provided. The computing device has a frame including a recessed battery compartment, the recessed battery compartment having a rigid back surface. The computing device further has a closure member having a rigid portion and a flexible portion, wherein a periphery of the closure member is coupled to a peripheral edge of the recessed battery compartment, the flexible portion to permit the rigid portion to move relative to the frame. The computing device further has a battery coupled to one or more of the battery compartment and the closure member, the battery oriented between and substantially adjacent to the rigid back surface of the battery compartment and the closure member.

Another example computing device of any preceding computing device is provided, wherein the rigid portion is composed of a sheet of rigid material with a planar surface, the planar surface of the sheet of rigid material coupled to a planar surface of a first sheet of flexible material, and wherein the flexible portion includes a band of the sheet of flexible material that is not coupled to the sheet of rigid material.

Another example computing device of any preceding computing device is provided, wherein the closure member is further composed of a second sheet of flexible material coupled to a second planar surface of the sheet of rigid material, the second sheet of flexible material being oriented substantially parallel with the first sheet of flexible material, wherein the sheet of rigid material is oriented between the first sheet of flexible material and the second sheet flexible material.

Another example computing device of any preceding computing device is provided, the computing device further comprising a second rigid portion composed of a band of rigid material, the band of rigid material surrounding a perimeter of the sheet of rigid material, with a gap therebetween, the band of rigid material coupled to the first sheet of flexible material at the peripheral edge of the closure member, the band of rigid material sharing a perimeter of the flexible portion.

Another example computing device of any preceding computing device is provided, wherein the flexible portion of the thin closure member is composed of a pierce-resistant material.

Another example computing device of any preceding computing device is provided, wherein the closure member includes a gap exclusively composed of flexible material.

Another example computing device of any preceding computing device is provided, wherein the rigid portion is recessed relative to an outside surface of the frame.

Another example computing device of any preceding computing device is provided, wherein the flexible portion of the closure member flexes to allow the rigid portion of the closure member to extend away from the rigid back surface of the battery compartment to be substantially flush with an outside surface of the frame.

Another example computing device of any preceding computing device is provided, wherein the flexible portion of the closure member flexes to allow the rigid portion of the closure member to extend away from the rigid back surface of the frame to protrude beyond an outside surface of the frame.

Another example computing device of any preceding computing device is provided, wherein the rigid portion of the closure member is substantially flush with the outside surface of the frame and the flexible portion of the thin closure member flexes to allow the rigid portion to expand beyond the outside surface of the frame.

Another example computing device of any preceding computing device is provided, the battery having a first primary planar surface and a second primary planar surface, the first primary planar surface in contact with the rigid back surface of the battery compartment and the second primary planar surface in contact with the closure member.

Another example computing device of any preceding computing device is provided, the battery having a first primary planar surface and a second primary planar surface, wherein the first primary planar surface is adhered to the rigid back surface of the battery compartment and the second primary planar surface is adhered to the closure member.

Another example computing device of any preceding computing device is provided, wherein the flexible portion of the closure member flexes to allow the rigid portion of the closure member to extend away from the rigid back surface of the frame from an initial position to a further 7-15% of a width of the battery, the width of the battery defined by a distance between the first primary planar surface of the battery and the second primary planar surface of the battery at a time of manufacture.

Another example computing device of any preceding computing device is provided, wherein the rigid portion of the closure member covers the entirety of a surface of an expanding region of the battery.

An example method of using a computing device having a battery is provided. The method includes activating the computing device such that the computing device consumes power from the battery, extending a closure member of the computing device away from a rigid back surface of a frame of the computing device as the battery expands, and retracting the closure member of the computing device towards the rigid back surface of the frame of the computing device as the battery contracts.

Another example method of any preceding method is provided that further includes maintaining substantial conformity of a first primary planar surface of the battery with a rigid back surface of a recessed battery compartment of a frame of the computing device and maintaining substantial conformity of a second primary planar surface of the battery with a surface of the closure member.

An example method of making a battery enclosure for a computing device is provided. The method includes coupling, to form a closure member, a portion of a surface of a flexible material with a first surface area to an entire surface of a rigid material with a smaller surface area, the surface of the flexible material extending beyond the coupling in all directions to which the flexible material extends, coupling a battery to one or more of the closure member and a recessed battery compartment of a frame of the computing device, and coupling a peripheral edge of the closure member to a peripheral edge of the recessed battery compartment.

Another example method of any preceding method is provided further comprising coupling, to further form the closure member, a rigid band to the surface of the flexible material, the second rigid portion circumscribing the rigid portion when coupled, but leaving a flexible band uncoupled to the rigid portion and the rigid band.

Another example method of any preceding method is provided further comprising coupling, to further form the thin closure member, a portion of a surface of a second flexible material layer to a second surface of the rigid material in an area that substantially overlaps the area where the portion of the surface of the flexible material is coupled to the surface of the rigid material, the surface of the second flexible material substantially overlapping the surface of the flexible material when coupled.

Another example method of any preceding method is provided further comprising positioning the battery to have a first primary planar surface of the battery substantially adjacent to a rigid back surface of the battery compartment and positioning the battery to have a second primary planar surface of the battery that opposes the first primary planar surface of the battery substantially adjacent to a surface of the closure member.

While this specification contains many specific implementation details, these should not be construed as limitations on the scope of any inventions or of what may be claimed, but rather as descriptions of features specific to particular implementations of particular described technology. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

A number of implementations of the described technology have been described. Nevertheless, it will be understood that various modifications can be made without departing from the spirit and scope of the recited claims.

What is claimed is:

1. A computing device comprising:
    a frame including a recessed battery compartment, the recessed battery compartment having a rigid back surface;
    a closure member having:
        a rigid portion; and
        a flexible portion, wherein a periphery of the closure member is coupled to a peripheral edge of the recessed battery compartment, the flexible portion to permit the rigid portion to move relative to the frame; and
    a battery coupled to one or more of the battery compartment and the closure member, the battery oriented between and substantially adjacent to the rigid back surface of the battery compartment and the closure member, the battery to remain in contact with both the battery compartment and the closure member as the rigid portion moves relative to the frame when the battery expands or contracts.

2. The computing device of claim 1, wherein the rigid portion is composed of a sheet of rigid material with a planar surface, the planar surface of the sheet of rigid material coupled to a planar surface of a first sheet of flexible material, and wherein the flexible portion includes a band of the sheet of flexible material that is not coupled to the sheet of rigid material.

3. The computing device of claim 2, wherein the closure member is further composed of a second sheet of flexible material coupled to a second planar surface of the sheet of rigid material, the second sheet of flexible material being oriented substantially parallel with the first sheet of flexible material,
wherein the sheet of rigid material is oriented between the first sheet of flexible material and the second sheet flexible material.

4. The computing device of claim 2, further comprising a second rigid portion composed of a band of rigid material, the band of rigid material surrounding a perimeter of the sheet of rigid material, with a gap therebetween, the band of rigid material coupled to the first sheet of flexible material at the peripheral edge of the closure member, the band of rigid material sharing a perimeter of the flexible portion.

5. The computing device of claim 1, wherein the flexible portion of the thin closure member is composed of a pierce-resistant material.

6. The computing device of claim 1, wherein the closure member includes a gap exclusively composed of flexible material.

7. The computing device of claim 1, wherein the rigid portion is recessed relative to an outside surface of the frame.

8. The computing device of claim 1, wherein the flexible portion of the closure member flexes to allow the rigid portion of the closure member to extend away from the rigid back surface of the battery compartment to be substantially flush with an outside surface of the frame.

9. The computing device of claim 1, wherein the flexible portion of the closure member flexes to allow the rigid portion of the closure member to extend away from the rigid back surface of the frame to protrude beyond an outside surface of the frame.

10. The computing device of claim 1, wherein the rigid portion of the closure member is substantially flush with the outside surface of the frame and the flexible portion of the thin closure member flexes to allow the rigid portion to expand beyond the outside surface of the frame.

11. The computing device of claim 1, the battery having a first primary planar surface and a second primary planar surface, the first primary planar surface in contact with the rigid back surface of the battery compartment and the second primary planar surface in contact with the closure member.

12. The computing device of claim 11, wherein the flexible portion of the closure member flexes to allow the rigid portion of the closure member to extend away from the rigid back surface of the frame from an initial position to a further 7-15% of a width of the battery, the width of the battery defined by a distance between the first primary planar surface of the battery and the second primary planar surface of the battery at a time of manufacture.

13. The computing device of claim 1, the battery having a first primary planar surface and a second primary planar surface, wherein the first primary planar surface is adhered to the rigid back surface of the battery compartment and the second primary planar surface is adhered to the closure member.

14. The computing device of claim 1, wherein the rigid portion of the closure member covers the entirety of a surface of an expanding region of the battery.

15. A method of using a computing device having a battery, comprising:
activating the computing device such that the computing device consumes power from the battery;
extending a closure member of the computing device away from a rigid back surface of a frame of the computing device as the battery expands, the battery to remain in contact with both the rigid back surface and the closure member as the battery expands; and
retracting the closure member of the computing device towards the rigid back surface of the frame of the computing device as the battery contracts, the battery to remain in contact with both the battery compartment and the closure member as the battery contracts.

16. The method of claim 15, further comprising:
maintaining substantial conformity of a first primary planar surface of the battery with a rigid back surface of a recessed battery compartment of a frame of the computing device; and
maintaining substantial conformity of a second primary planar surface of the battery with a surface of the closure member.

17. A method of making a battery enclosure for a computing device, comprising:
coupling, to form a closure member, a portion of a surface of a flexible material with a first surface area to an entire surface of a rigid portion with a smaller surface area, the surface of the flexible material extending beyond the coupling in all directions to which the flexible material extends;
coupling a battery to one or more of the closure member and a recessed battery compartment of a frame of the computing device; and
coupling a peripheral edge of the closure member to a peripheral edge of the recessed battery compartment, the battery to remain in contact with both the recessed battery compartment and the closure member as the rigid portion moves relative to the frame when the battery expands or contracts.

18. The method of claim 17, further comprising:
coupling, to further form the closure member, a rigid band to the surface of the flexible material, the second rigid portion circumscribing the rigid portion when coupled, but leaving a flexible band uncoupled to the rigid portion and the rigid band.

19. The method of claim 17, further comprising:
coupling, to further form the thin closure member, a portion of a surface of a second flexible material layer to a second surface of the rigid portion in an area that substantially overlaps the area where the portion of the surface of the flexible material is coupled to the surface of the rigid portion, the surface of the second flexible material substantially overlapping the surface of the flexible material when coupled.

20. The method of claim 17, further comprising:
positioning the battery to have a first primary planar surface of the battery substantially adjacent to a rigid back surface of the battery compartment; and
positioning the battery to have a second primary planar surface of the battery that opposes the first primary planar surface of the battery substantially adjacent to a surface of the closure member.

* * * * *